United States Patent
O'Connell et al.

(10) Patent No.: US 7,106,234 B2
(45) Date of Patent: Sep. 12, 2006

(54) DIGITAL TO ANALOG CONVERTER WITH REDUCED OUTPUT NOISE

(75) Inventors: John Oliver O'Connell, County Cork (IE); Colin Lyden, County Cork (IE)

(73) Assignees: University College Cork - National University of Ireland, Cork (IE); Analog Devices, Inc., Norwood, MA (US)

(*) Notice: Subject to any disclaimer, the term of this patent is extended or adjusted under 35 U.S.C. 154(b) by 0 days.

(21) Appl. No.: 11/038,242

(22) Filed: Jan. 21, 2005

(65) Prior Publication Data
US 2005/0185475 A1 Aug. 25, 2005

Related U.S. Application Data

(60) Provisional application No. 60/537,892, filed on Jan. 22, 2004.

(51) Int. Cl.
*H03M 1/66* (2006.01)
(52) U.S. Cl. .................... 341/144; 341/155
(58) Field of Classification Search ............ 341/144, 341/118, 120, 172, 155
See application file for complete search history.

(56) References Cited

U.S. PATENT DOCUMENTS

| | | | |
|---|---|---|---|
| 4,568,917 A * | 2/1986 | McKenzie et al. | 341/118 |
| 5,153,592 A * | 10/1992 | Fairchild et al. | 341/118 |
| 5,200,750 A | 4/1993 | Fushiki et al. | 341/143 |
| 5,274,375 A | 12/1993 | Thompson | 341/143 |
| 5,666,118 A * | 9/1997 | Gersbach | 341/120 |
| 6,331,830 B1 * | 12/2001 | Song et al. | 341/118 |
| 6,473,019 B1 * | 10/2002 | Ruha et al. | 341/143 |

OTHER PUBLICATIONS

Senderowicz et al, IEEE Jour of Solid-State Circuits, vol. 32, No. 12, Dec. 1997, pp. 1907-1919, Low-voltage Double-Sampled . . . .
Yang et al, IEEE Trans on Circuits . . . , vol. 43, No. 7, Jul. 1996, pp. 524-529, Double Sampling Delta-Sigma Modulators.

* cited by examiner

*Primary Examiner*—Lam T Mai
(74) *Attorney, Agent, or Firm*—Jacobson Holman PLLC

(57) ABSTRACT

A DAC (1) has a switched element capacitor (7, Cr) to which charge is delivered via switches (6, S1/S2) depending on required analog voltage level (Vref1, Vref2). An output switch (S3) is closed and a ground switch (S4) is opened to deliver charge to the output according to received bi-level digital inputs (+1, −1). The control block (2) has a memory and determines an inactive output level if there is an input digital transition from +1 to −1 or from −1 to +1. For the inactive level S3 is kept open and S4 is kept closed. Thus, for every clock cycle with one of these transitions there is no charge transfer and hence no thermal noise. Overall noise is therefore considerably reduced.

9 Claims, 6 Drawing Sheets

Low Pass

| | Previous Input | Present Input | DAC o/p | Comments |
|---|---|---|---|---|
| (a) | +1 | +1 | 1 | During Φ1: Cr is charged by S4 being closed, S3 being opened, and one of S1 and S2 being closed. This provides Vref1 or Vref2 on Cr. During Φ2: for data transition of +1 to +1, close S3 and one of S1 or S2 to transfer a unit of charge (Vref1 – Vref2) from Cr to the DAC output. |
| (b) | +1 | –1 | 0 | During Φ1: as above. On Φ2, S3 remains open ensuring no charge is transferred from Cr. Because there is no transfer of charge there is no noise. |
| (c) | –1 | +1 | 0 | During Φ1: as above. During Φ2: as for row (b) above. Again, no noise transfer. |
| (d) | –1 | –1 | –1 | During Φ1: as above. During Φ2: as for row (a). |

Fig. 3

DIGITAL TO ANALOG CONVERTER WITH REDUCED OUTPUT NOISE

This is a complete application claiming benefit of provisional 60/537,892 filed Jan. 22, 2004.

BACKGROUND OF THE INVENTION

1. Field of the Invention

The invention relates to a digital to analog converter (DAC).

2. Prior Art Discussion

Many known DACs use a capacitor as the switched element, and output a unit of charge which directly corresponds to the input signal. Consequently an N-level DAC has N input levels and N output levels, where there is a direct correspondence between each input level and an associated output level. In the single bit case, where N=2, the input levels are typically 1,−1 which correspond to a positive or negative unit charge being delivered to the output terminal of the DAC respectively. For such DACs the output noise is independent of the input/output level, i.e. each output level results in the same noise. Noise is represented as follows:

$$I_{eq}^2 = 2kTCfs^2 f_B / (f_S/2)$$
$$= 4kTCf_S f_B$$
$$(\text{or } V_{eq}^2 = kT/C)$$

where K is Boltzmann's constant, T is the absolute temperature, C is the capacitance which is being switched, $f_s$ is the modulator sampling frequency and $f_B$ is the bandwidth of interest.

Thus, where there is a small output level the noise can be proportionately large.

A tri-level DAC is described in U.S. Pat. No. 5,274,375, where N=3, there are three input levels 1,0,+1 and three associated output levels which have a direct relationship with a corresponding input level. Similar to the bi-level DAC described above, a positive or negative signal is delivered to the output terminal of the DAC, when the input is either 1 or −1. However, when a zero input signal is present a "do nothing" state is created whereby zero charge is delivered at the output terminal of the DAC, with zero added noise. Thus, because there is no noise introduced at each zero level overall noise is reduced. However, achievement of this requires provision of a "do nothing" instruction at the input.

Another DAC type exists in which there are two input levels and three output levels, such that only the average input signal is delivered to the output terminal in a given clock cycle. In this case, in the third level zero signal is delivered to the output terminal of the DAC when the input changes from one clock cycle to the next. However, noise is still delivered to the output, even in the presence of no output signal. This is achieved by the switched control block of the switched element. The references are: D. Senderowicz, G. Nicollini, S. Pernici, A. Nagari, P. Confalonieri, and C. Dallavalle, "Low-Voltage Double-Sampled Sigma Delta Converters" IEEE Journal of Solid State Circuits, vol. 32, no. 12, pp. 1907–1919, December 1997, and H. K. Yang and E. I. El-Masry, "Double Sampling Delta-Sigma Modulators", Circuits and Systems II: Analog and Digital Signal Processing, IEEE Transactions on, vol. 43, no. 7, pp. 524–529, July 1996. This DAC ("bilinear DAC") differs from the tri-level DAC in that the "zero level" or "do nothing state" is not directly accessible at the input of the DAC. The output state results from a non-static input signal, such that the average charge outputted is zero. The DAC continues to output noise, even when a zero signal is outputted.

U.S. Pat. No. 5,200,750 describes a Sigma Delta DAC which detects a zero input signal, and reduces the noise within the Sigma Delta modulator for this input level.

The invention is therefore directed towards reducing the output noise of a DAC.

SUMMARY OF THE INVENTION

The invention provides a digital to analog converter comprising:
  an output stage;
  a control block for controlling the output stage in response to receiving digital inputs at N levels; and
  wherein the control block controls a switched element to provide >N analog output levels, including an inactive level in which no output and consequently no thermal noise is delivered by the digital to analog converter.

Because some cycles are inactive and introduce no noise, overall noise is considerably reduced for many applications. This is achieved without need for an external circuit to provide a "do nothing" input.

In one embodiment, the control block has a memory and determines the inactive level according to previous and present digital input levels. This is a particularly effective way of generating the additional output level without need for a "do nothing" input.

In another embodiment, the memory comprises a register.

In a further embodiment, the control block has a memory and determines the inactive state if there is a change between previous and present digital input levels.

In one embodiment, said change in digital input level is between a positive level and a negative level of equal magnitude.

In another embodiment, said change in digital input level is between a negative level and a positive level of equal magnitude.

In a further embodiment, the output stage comprises a switched element and switches operating the switched element.

In one embodiment, the switched element comprises a capacitor, and the switches comprise an output switch for delivering charge from the capacitor to provide an output, and a control switch between the capacitor and ground, and the control block keeps the output switch open and the control switch closed for the inactive level.

In another embodiment, the switched element comprises a capacitor, and the switches comprise an output switch for delivering charge from the capacitor to provide an output, and a control switch between the capacitor and ground, and the control block keeps the output switch open and the control switch closed for the inactive level, and the control block uses two clock phases, one of said phases being for switch reset and the other being for switch control according to a decision of an output level.

The invention also provides an analog to digital converter (ADC) comprising an analog filter, a quantizer, and a feedback loop comprising a digital to analog converter as described above.

In one embodiment, the analog filter comprises at least one bilinear integrator.

In another embodiment, the analog filter is of fully differential symmetrical design.

BRIEF DESCRIPTION OF THE DRAWINGS

The invention will be more clearly understood from the following description of some embodiments thereof, given by way of example only with reference to the accompanying drawings in which:

FIG. 3 is a table describing the operation of the DAC for different data input transitions.

DETAILED DESCRIPTION OF THE INVENTION

Figure 1:
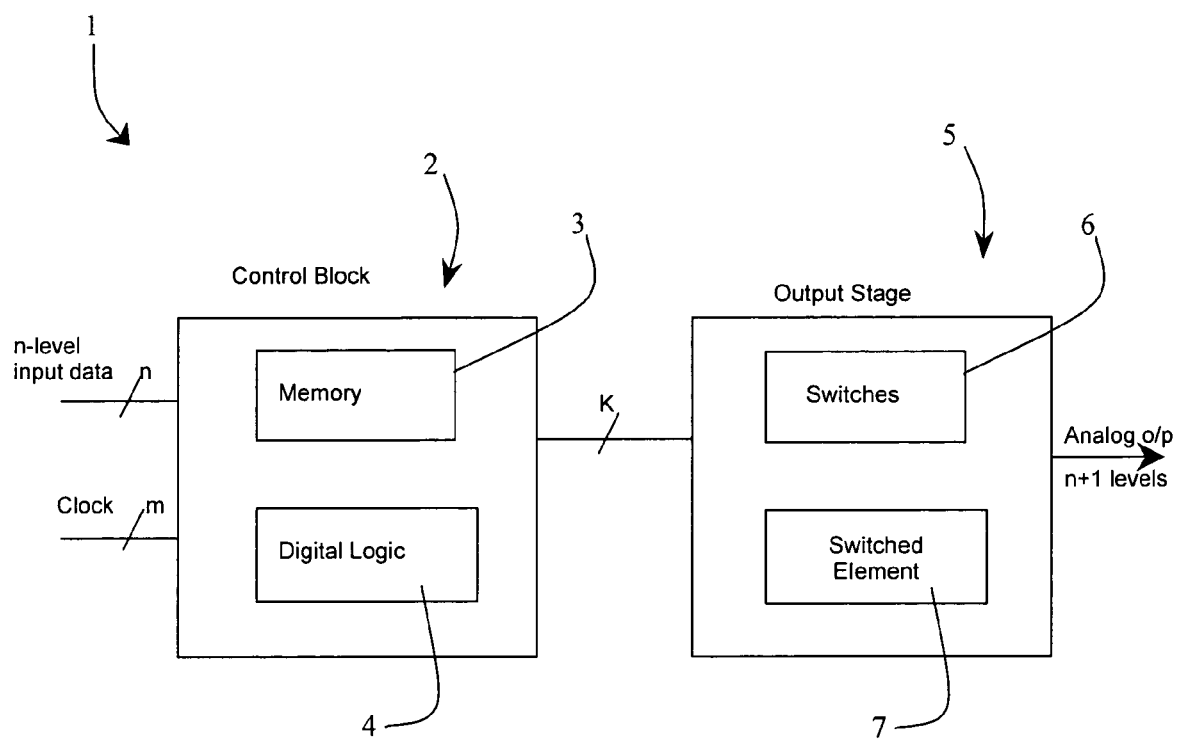
FIG. 1 is a high-level block diagram of a DAC of the invention.

Referring to FIG. 1 a DAC 1 of the invention comprises a control block 2 having a memory 3 and digital logic 4. The memory 3 comprises a latch which stores the previous digital input. The digital logic 4 comprises logic gates which compare the latch output (containing the previous digital input) with the current digital input. The DAC 1 also comprises an output stage 5 comprising switches 6 and a switched element 7.

In general, there are n input data levels and in this embodiment n=2. There are m clock phases, and m=2. An output stage 5 is controlled to provide n+1 output levels. The additional output level is achieved by providing a "do nothing" level in response to particular patterns of past and present input levels.

Thus, a bi-level input results in a tri-level output, one of which is a "do nothing" state, whereby no signal and no noise is delivered to the output terminal of the DAC. The scheme may be represented briefly as follows:

| Previous Input | Present Input | Output | Comment |
| --- | --- | --- | --- |
| +1 | +1 | +1 | Output Positive Unit Charge |
| +1 | −1 | 0 | Do nothing |
| −1 | +1 | 0 | Do nothing |
| −1 | −1 | −1 | Output Negative Unit of Charge |

Figure 2:
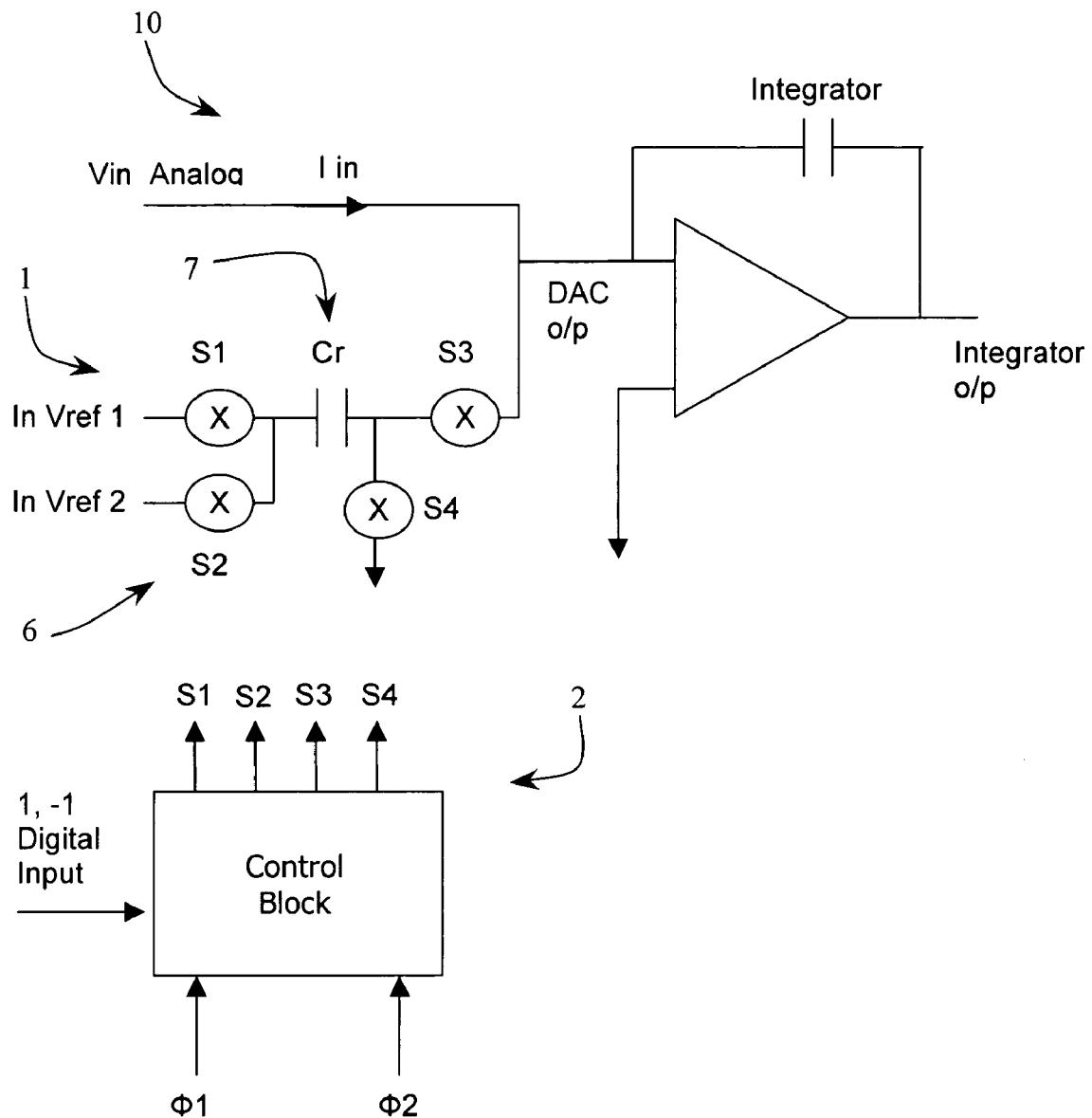
FIG. 2 is a more detailed diagram showing the DAC providing a reference analog input to an integrator.

Referring to FIG. 2 in more detail the switches 6 comprise a switch S1 at a Vref1 input, a switch S2 at a Vref2 input, a switch S3 for delivering charge to the DAC output, and a switch S4 for connection to ground to allow charging of the switching element. The switched element 7 is a capacitor, Cr, for the storage of charge and delivery of the charge in some cycles to the DAC output via S3. In this embodiment the value is 1 pF, although any suitable value depending on the application may be chosen. The control block 2 receives the bi-level digital input −1, +1, two clock phases φ1 and φ2, and delivers control signals for S1, S2, S3 and S4.

The DAC 1 output provides a reference charge of Vref*Cr, where Vref=Vref1−Vref2, to an integrator according to the received digital input. The other integrator input is Vin. Other applications of the DAC 1 will be immediately appreciated by those skilled in the art.

Figure 4:
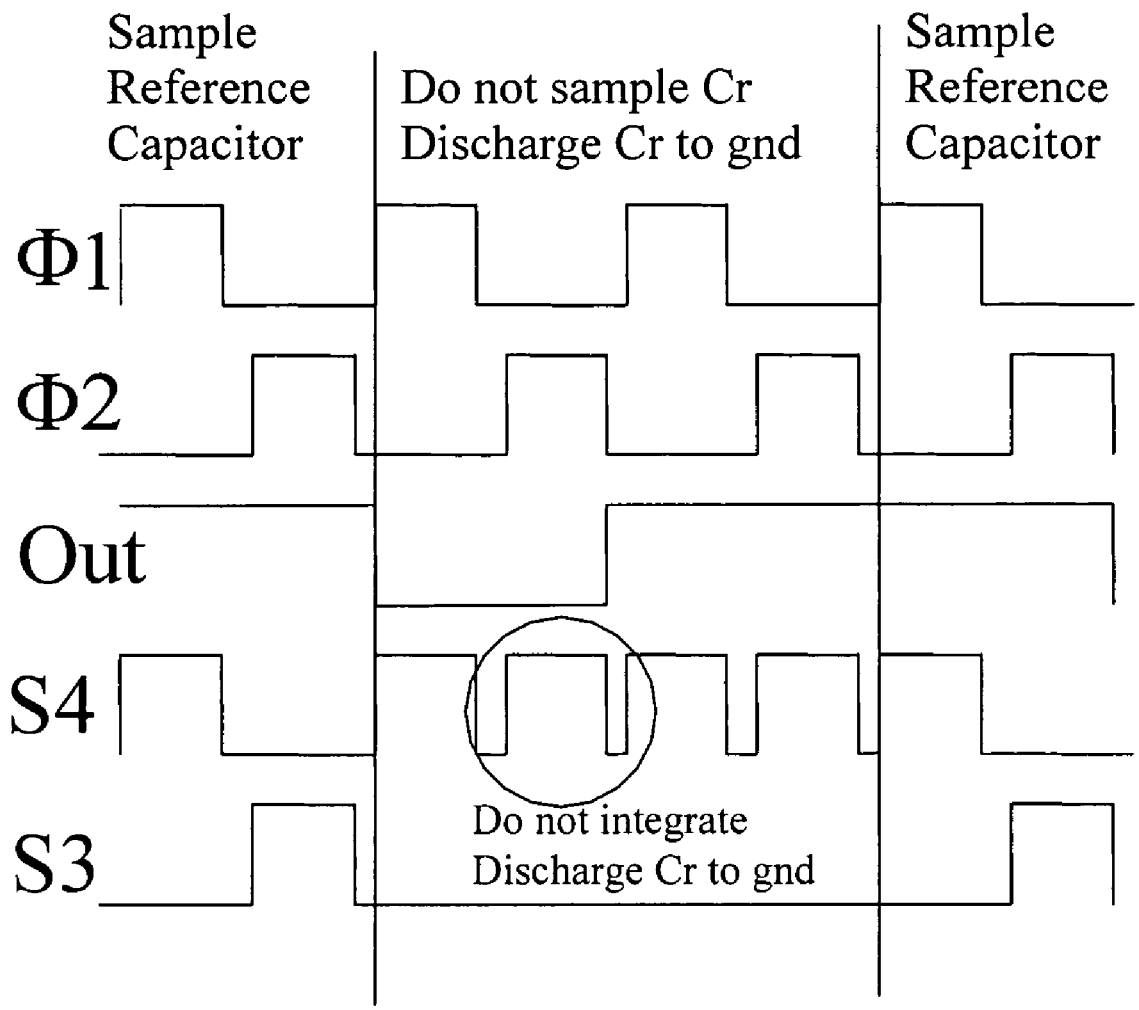
FIG. 4 is a set of plots showing corresponding clock and switch status.

Operation of the DAC 1 is now described in more detail with reference to FIGS. 3 and 4. In row (a) the difference between Vref1 and Vref2 which is stored on Cr is discharged through S3 once the first clock phase is over and the second phase begins, if the previous and present digital inputs are +1.

However, as shown by rows (b) and (c) if there is a digital input transition from +1 to −1 or from −1 to +1 S3 remains open in the second phase and no charge is delivered. Thus for both of these rows, the DAC output is an average of the previous and present digital inputs and there is no noise introduced because S3 is kept open. For an input sequence in which −1 appears for both the previous and present inputs, S3 is closed for delivery of a −1 output (the opposite of the charge delivered for row (a)). The row (b) and (c) states are shown between the vertical lines of FIG. 4, in which the low control value for S3 means that it remains open, and the high control value for S4 means that it remains closed to hold the charge on Cr.

The operation of the DAC 1 may also be described as follows, from a φ1 and φ2 perspective.

φ1 Clock Cycle
  (a) Begins with all switches S1–S4 open.
  (b) Close S1 if the data input is +1, OR
  (c) close S2 if the data input is −1.
  (d) Close S4
  (e) Open all closed switches in reverse order of closing.

φ2 Clock Cycle
  (a) Begin with all switches S1–S4 open.
  (b) Close S1 if the data input is −1, OR
  (c) Close S2 if the data input is +1.
  (d) Close S3, or leave open according to condition,
  (e) Open all closed switches in reverse order of closing.

Figure 5:
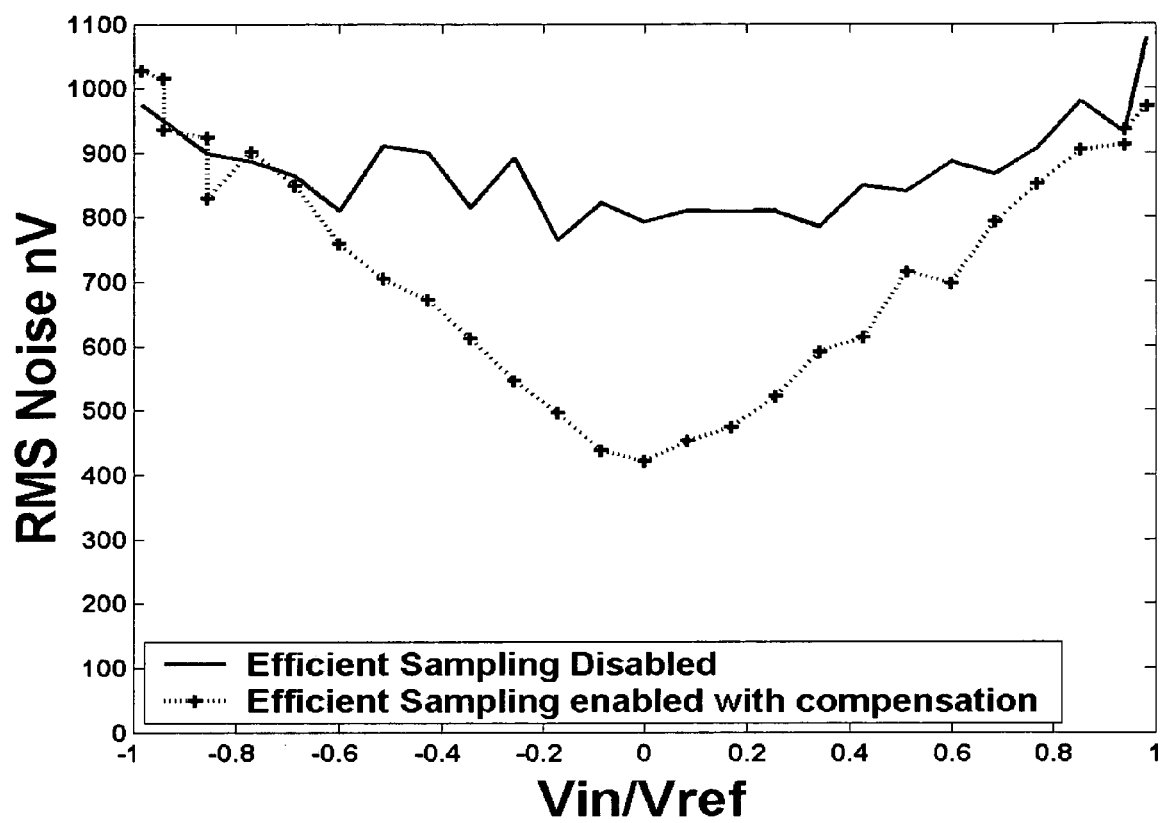
FIG. 5 is a plot showing performance of a switched capacitor ΣΔ modulator employing this DAC.

It will be appreciated that by avoiding noise introduction (often called "thermal noise") during clock cycles for digital transitions +1 to −1 and −1 to +1 overall thermal noise is considerably reduced. FIG. 5 shows RMS noise plots for scenarios in which the DAC operates within a ΣΔ modulator as described above, and in which a conventional two-level input and two-level output DAC is used. This demonstrates that where Vin is close to 0 the noise reduction is greatest as there are frequent −1 to +1 and +1 to −1 transitions.

The DAC 1 of the invention is particularly advantageous if one or more of them are employed in a sigma-delta ADC.

Figure 6:
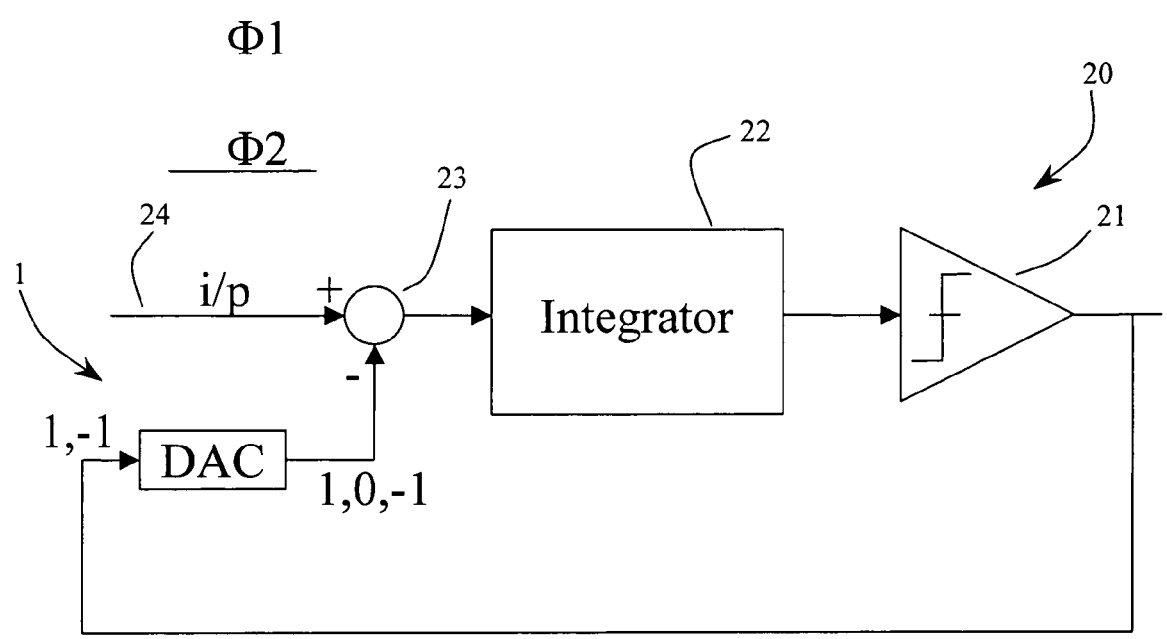
FIG. 6 is a diagram showing implementation of the DAC in a sigma-delta ADC.

Referring to FIG. 6 a first order sigma-delta modulator 20 is shown consisting of a quantiser 21, a DAC 1 (with two input levels and three output levels), an integrator 22 and a summing node 23. The integrator 22 integrates the difference between an input signal at 24 and the DAC output. The feedback loop ensures that the output of the integrator 22 remains small over multiple clock periods, thus ensuring that the quantiser output on average matches the input signal. A more accurate representation of the input signal can be obtained by increasing the number of quantiser outputs used to determine the input signal.

In this application, the fact that the DAC 1 introduces significantly reduced noise to the summing junction 23 is particularly advantageous because the noise added by the DAC in the prior art ΣΔ modulators can be the dominant noise source.

The invention is not limited to the embodiments described but may be varied in construction and detail. For example a similar feedback mechanism could be applied to sigma-delta ADCs having an analog filter with a bilinear integrator. In more detail, the benefit of a bilinear integrator is that it already contains a zero level with noise being added. Consequently, ensuring that no noise is added by the zero level does not alter the noise transfer function of the sigma delta modulator.

Also, multiple DACs may be employed in parallel to realise a multi-bit DAC.

The invention is not limited to the embodiments described but may be varied in construction and detail. For example, the memory may alternatively comprise a latch.

The invention claimed is:

1. A digital to analog converter comprising:
   an output stage; and
   a control block for controlling the output stage in response to receiving digital inputs at N levels;
   wherein the control block controls a switched element to provide >N analog output levels, including an inactive level in which no output and consequently no thermal noise is delivered by the digital to analog converter, and
   wherein the control block has a memory and determines the inactive level according to previous and present digital input levels.

2. The digital to analog converter as claimed in claim 1, wherein the memory comprises a register.

3. The digital to analog converter as claimed in claim 1, wherein the control block determines the inactive state if there is a change between previous and present digital input levels.

4. The digital to analog converter as claimed in claim 3, wherein said change in digital input level is between a positive level and a negative level of equal magnitude.

5. The digital to analog converter as claimed in claim 3, wherein said change in digital input level is between a negative level and a positive level of equal magnitude.

6. A digital to analog converter comprising:
   an output stage; and
   a control block for controlling the output stage in response to receiving digital inputs at N levels;
   wherein the control block controls a switched element to provide >N analog output levels, including an inactive level in which no output and consequently no thermal noise is delivered by the digital to analog converter,
   wherein the output stage comprises the switched element and switches operating the switched element, and
   wherein the switched element comprises a capacitor, and the switches comprise an output switch for delivering charge from the capacitor to provide an output, and a control switch between the capacitor and ground, and the control block keeps the output switch open and the control switch closed for the inactive level.

7. The digital to analog converter as claimed in claim 6, wherein the control block uses two clock phases, one of said phases being for switch reset and the other being for switch control according to a decision of an output level.

8. An analog to digital converter (ADC) comprising an analog filter, a quantizer, and a feedback loop comprising a digital to analog converter, said digital to analog converter comprising;
   an output stage; and
   a control block for controlling the output stage in response to receiving digital inputs at N levels;
   wherein the control block controls a switched element to provide >N analog output levels, including an inactive level in which no output and consequently no thermal noise is delivered by the digital to analog converter, and
   wherein the analog filter comprises at least one bilinear integrator.

9. An analog to digital converter (ADC) comprising an analog filter, a quantizer, and a feedback loop comprising a digital to analog converter, said digital to analog converter comprising:
   an output stage; and
   a control block for controlling the output stage in response to receiving digital inputs at N levels;
   wherein the control block controls a switched element to provide >N analog output levels, including an inactive level in which no output and consequently no thermal noise is delivered by the digital to analog converter,
   wherein the analog filter comprises at least one bilinear integrator, and
   wherein the analog filter is of fully differential symmetrical design.

* * * * *